(12) United States Patent
Oh et al.

(10) Patent No.: US 12,096,647 B2
(45) Date of Patent: Sep. 17, 2024

(54) DISPLAY DEVICE

(71) Applicant: LG Display Co., Ltd., Seoul (KR)

(72) Inventors: Yeonjun Oh, Gimpo-si (KR); Sangwon Yoon, Seoul (KR); Chanwoo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 560 days.

(21) Appl. No.: 17/483,466

(22) Filed: Sep. 23, 2021

(65) Prior Publication Data

US 2022/0199940 A1 Jun. 23, 2022

(30) Foreign Application Priority Data

Dec. 17, 2020 (KR) ........................ 10-2020-0177456

(51) Int. Cl.
*H10K 50/842* (2023.01)
*H10K 59/131* (2023.01)

(52) U.S. Cl.
CPC ....... *H10K 50/8426* (2023.02); *H10K 59/131* (2023.02)

(58) Field of Classification Search
CPC .................... H10K 50/8426; H10K 59/131
See application file for complete search history.

(56) References Cited

U.S. PATENT DOCUMENTS

2020/0152907 A1  5/2020  Oh et al.

FOREIGN PATENT DOCUMENTS

| KR | 20160004484 | * | 1/2016 |
| KR | 10-2020-0053133 A | | 5/2020 |

* cited by examiner

*Primary Examiner* — Mohammad M Choudhry
(74) *Attorney, Agent, or Firm* — Birch, Stewart, Kolasch & Birch, LLP

(57) ABSTRACT

A display device according to an example of the present disclosure includes a lower substrate divided into an active area and a non-active area, an upper substrate disposed above the lower substrate, a flexible film connected to a pad area of the lower substrate in the non-active area, a first sealing film disposed in the pad area and having at least one open hole, and a second sealing film disposed on a top surface of the flexible film and a side surface of the upper substrate. By this configuration, moisture which may permeate through a side surface of the display device can be more effectively blocked.

20 Claims, 15 Drawing Sheets

DISPLAY DEVICE

CROSS-REFERENCE TO RELATED APPLICATIONS

This application claims the priority of Korean Patent Application No. 10-2020-0177456 filed on Dec. 17, 2020, in the Korean Intellectual Property Office, the entire contents of which are hereby expressly incorporated herein by reference into the present application.

BACKGROUND

Field

The present disclosure relates to a display device, and more particularly, to a flexible display device using a flexible substrate.

Description of the Related Art

Currently, as it enters a full-scale information era, a field of a display device which visually expresses electrical information signals has been rapidly developed and studies are continued to improve performances of various display devices such as a thin-thickness, a light weight, and low power consumption.

Among various display device, an organic light emitting display device is a self-emitting display device so that a separate light source is not necessary, which is different from a liquid crystal display device. Therefore, the organic light emitting display device can be manufactured to have a light weight and a small thickness. Further, since the organic light emitting display device is driven at a low voltage so that it is advantageous not only in terms of power consumption, but also in terms of color implementation, a response speed, a viewing angle, a contrast ratio (CR). Therefore, it is expected to be utilized in various fields.

In such an organic light emitting display device, a sealing layer is formed in an edge area of the organic light emitting display device to suppress moisture permeation from a side surface and minimize defects during a subsequent process. However, the sealing layer is cured by the curing process so that when the sealing layer is forcibly separated for a repairing process after forming the sealing layer, there is a problem in that components of the organic light emitting display device are damaged. Further, in the case of the flexible display device using a flexible substrate such as polyimide (PI), there is a limitation in that the curl of the PI substrate after a laser lift-off (LLO) process is not completely suppressed.

SUMMARY OF THE DISCLOSURE

An object to be achieved by the present disclosure is to provide a display device in which a sealing film formed of a metal material is used instead of a sealing layer of the related art so that when a defect is generated, a repairing process can be performed and lateral moisture permeability is improved.

Another object to be achieved by the present disclosure is to provide a display device which applies a sealing film to an edge area of the display panel to improve the curl of the polyimide (PI) substrate.

Still another object to be achieved by the present disclosure is to provide a display device which applies a sealing film to a rollable display device to reduce a stress in a pad area or a gate in panel (GIP) area.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device can include a lower substrate which is divided into an active area and a non-active area, an upper substrate disposed above the lower substrate, a flexible film which is connected to a pad area of the lower substrate in the non-active area, a first sealing film which is disposed in the pad area and includes at least one open hole and a second sealing film which is disposed on a top surface of the flexible film and a side surface of the upper substrate.

Other detailed matters of the exemplary embodiments are included in the detailed description and the drawings.

According to the present disclosure, a structure of a display device which is capable of performing a repairing process for a sealing film to improve a manufacturing yield of the display device and reduce a manufacturing cost.

Further, according to the present disclosure, moisture which can permeate through a side surface of the display device can be more effectively blocked.

Further, according to the present disclosure, a stress in the pad area or the gate in panel (GIP) area is reduced to suppress a crack during the rolling of the rollable display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
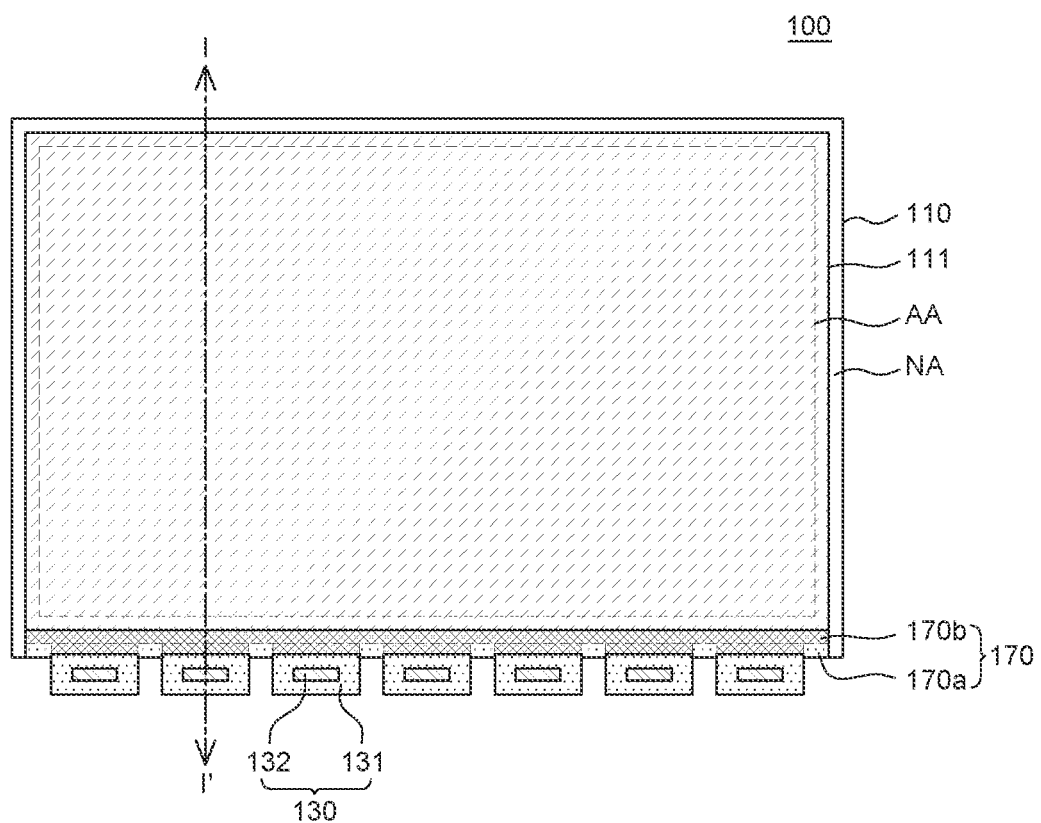
FIG. 1 is a schematic plan view of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a schematic plan view of a display device according to a first exemplary embodiment of the present disclosure.

Figure 2:
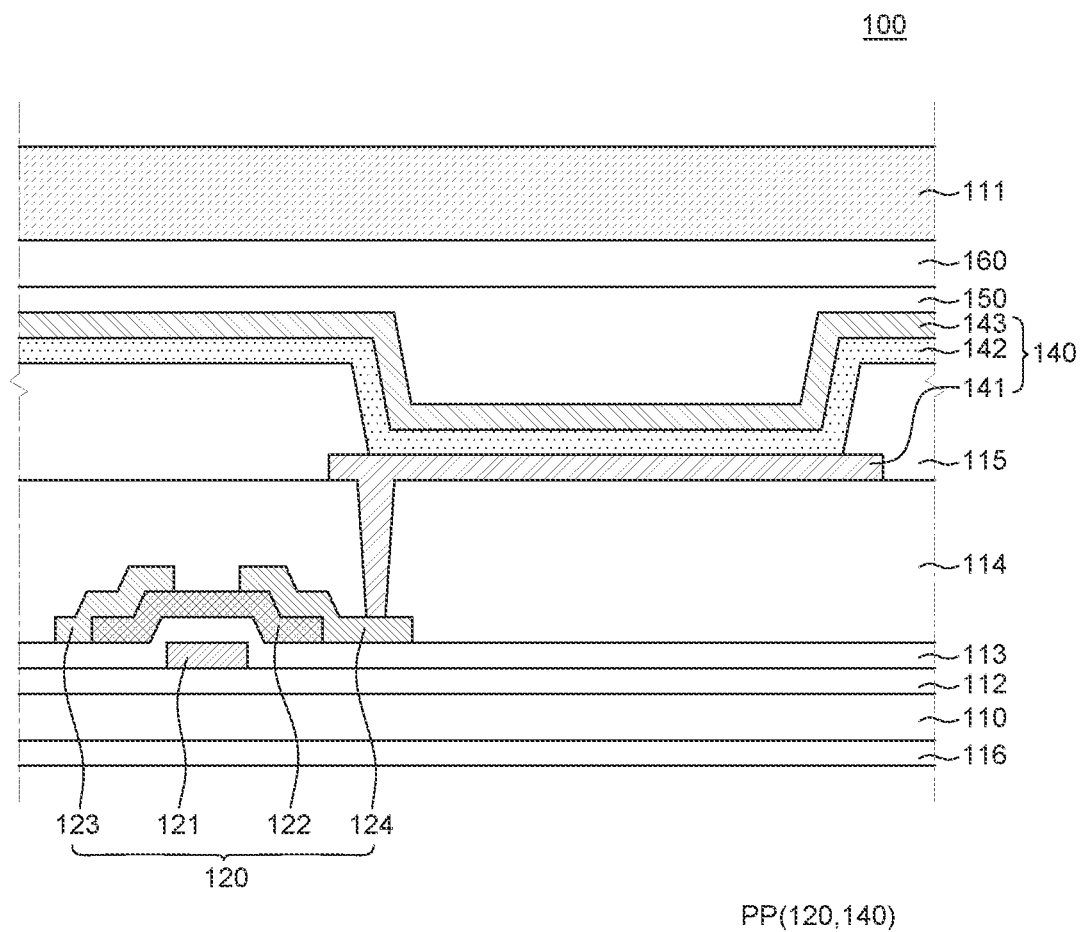
FIG. 2 is a cross-sectional view illustrating a pixel structure of the display device of FIG. 1 as an example.

FIG. 2 is a cross-sectional view illustrating a pixel structure of the display device of FIG. 1 as an example.

Figure 3:
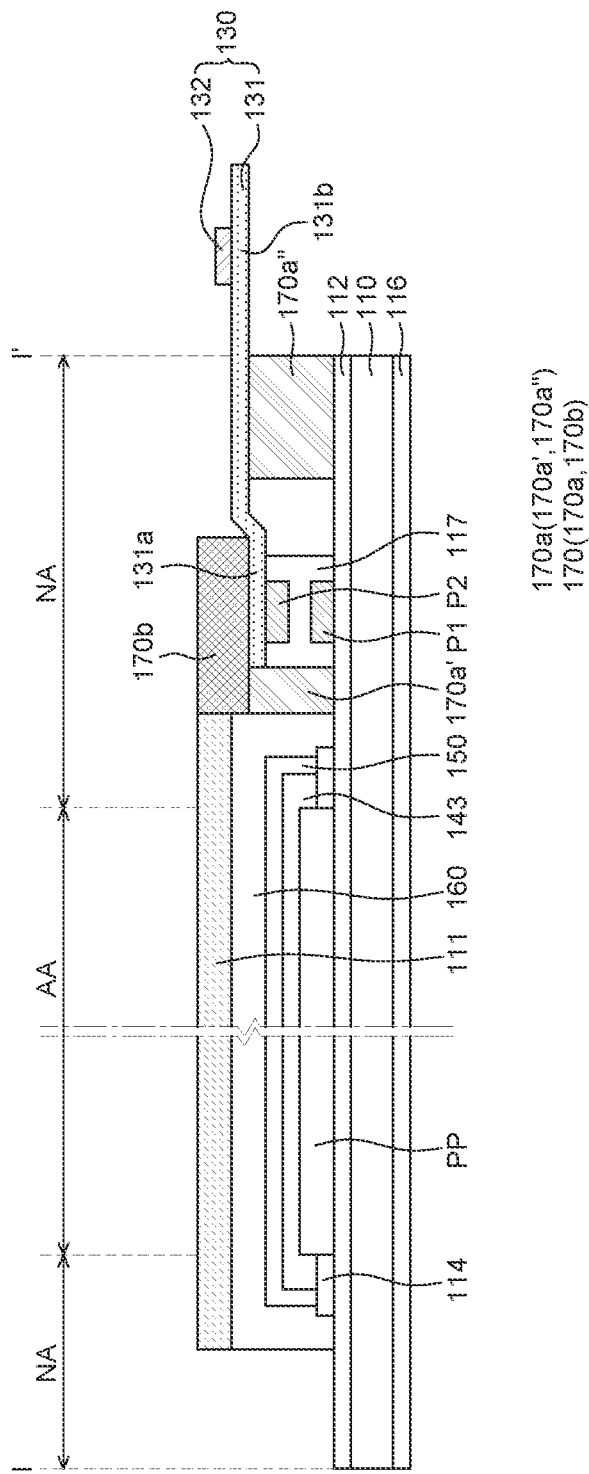
FIG. 3 is a cross-sectional view taken along the line I-I' of FIG. 1.

FIG. 3 is a cross-sectional view taken along the line I-I' of FIG. 1.

Figure 4A:
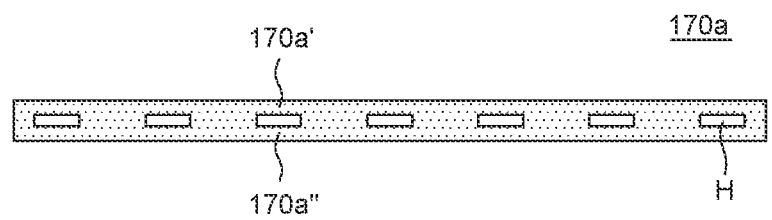
FIGS. 4A and 4B are plan views of a sealing film according to a first exemplary embodiment of the present disclosure.
Figure 4B:
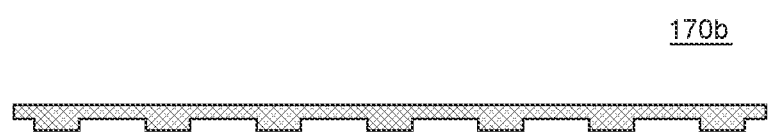

FIGS. 4A and 4B are plan views of a sealing film according to a first exemplary embodiment of the present disclosure.

Figure 4C:
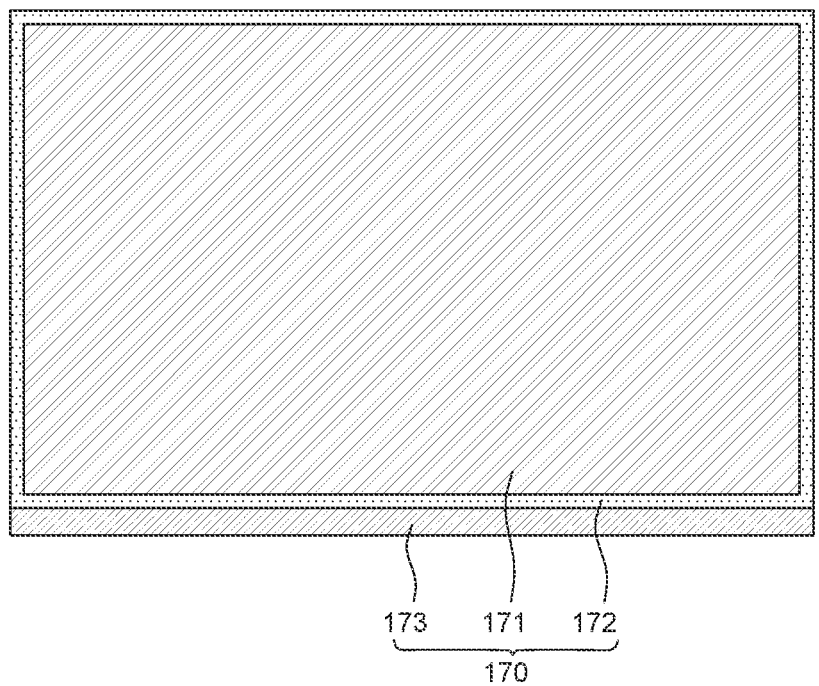
FIG. 4C is a cross-sectional view of a sealing film according to the first exemplary embodiment of the present disclosure.

FIG. 4C is a cross-sectional view of a sealing film according to the first exemplary embodiment of the present disclosure.

For the convenience of illustration, in FIG. 1, among various components of a display device 100, a lower substrate 110, an upper substrate 111, a flexible film 130, and a sealing film 170 are illustrated, and in FIG. 3, a pixel unit PP is schematically illustrated.

For example, FIG. 4A illustrates a plan view of a first sealing film 170*a* and FIG. 4B illustrates a plan view of a second sealing film 170*b*.

Hereinafter, for the convenience of description, it is described that the display device 100 according to the first exemplary embodiment of the present disclosure is an organic light emitting display device, specifically, a bottom emission type organic light emitting display device, but it is not limited thereto.

Referring to FIGS. 1 to 3, the display device 100 according to the first exemplary embodiment of the present disclosure can include a lower substrate 110, a thin film transistor 120, an organic light emitting diode 140, a flexible film 130, a sealing film 170, and an upper substrate 111.

The lower substrate 110 is a base member for supporting other components of the display device 100 and can be configured by an insulating material.

Further, the lower substrate 110 can be formed of a material having a flexibility. Therefore, the display device 100 according to the first exemplary embodiment of the present disclosure can be applied to various flexible display devices, such as a foldable display device, a rollable display device, and a stretchable display device. In this case, the lower substrate 110 can be formed of a plastic material such as polyimide (PI).

The lower substrate 110 includes an active area AA and a non-active area NA.

The active area AA is an area where a plurality of sub pixels is disposed to display images.

In the active area AA, a plurality of sub pixels for displaying images and a circuit unit for driving the plurality of sub pixels can be formed. Each of the plurality of sub pixels is a minimum emission unit and for example, can include a red sub pixel, a green sub pixel, a blue sub pixel, and a white sub pixel, but is not limited thereto. The circuit unit can include various thin film transistors 120, capacitors, and wiring lines for driving the sub pixels. For example, the circuit unit can be configured by various components such as a driving thin film transistor, a switching thin film transistor, a storage capacitor, a gate line, and a data line, but is not limited thereto.

The non-active area NA is an area where no image is displayed. For example, in the non-active area NA, various driving elements for driving the plurality of sub pixels in the active area AA can be disposed, for example, a gate driving circuit, a gate driver IC, a data driver IC, a flexible film 130, or the like, can be disposed, but it is not limited thereto.

The non-active area NA can be an area which encloses the active area AA as illustrated in FIG. 1, but it is not limited thereto and the non-active area NA can be defined as an area extending from the active area AA.

Referring to FIGS. 2 and 3, a buffer layer 112 can be disposed on the lower substrate 110. The buffer layer 112 can be disposed on a front surface of the lower substrate 110. The buffer layer 112 can improve adhesiveness between layers disposed on the buffer layer 112 and the lower substrate 110 and block alkali components leaked from the lower substrate 110.

The buffer layer 112 can be formed as a single-layer of silicon nitride (SiNx) or silicon oxide (SiOx) or a multi-layer of silicon nitride (SiNx) and silicon oxide (SiOx), but it is not limited thereto. At this time, the buffer layer 112 is not an essential component and can be omitted based on a type or a material of the lower substrate 110 and a structure and a type of a thin film transistor 120 or can be formed only in the active area AA.

The thin film transistor 120 can be disposed above the lower substrate 110.

The thin film transistor 120 can be used as a driving element of the display device 100.

The thin film transistor 120 can include a gate electrode 121, an active layer 122, a source electrode 123, and a drain electrode 124. In the display device 100 according to the exemplary embodiment of the present disclosure, the thin film transistor 120 has a structure in which the active layer 122 is disposed above the gate electrode 121 and the source electrode 123 and the drain electrode 124 are disposed above the active layer 122. Therefore, the thin film transistor 120 has a bottom gate structure in which the gate electrode 121 is disposed in the lowermost portion, but is not limited thereto.

The gate electrode 121 of the thin film transistor 120 can be disposed on the buffer layer 112. The gate electrode 121 can be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

A gate insulating layer 113 can be disposed on the gate electrode 121. The gate insulating layer 113 is a layer for electrically insulating the gate electrode 121 from the active layer 122 and can be formed of an insulating material. For example, the gate insulating layer 113 can be formed as a single-layer of silicon nitride (SiNx) or silicon oxide (SiOx) which is an inorganic material or a multi-layer of silicon nitride (SiNx) or silicon oxide (SiOx), but it is not limited thereto.

The active layer 122 can be disposed on the gate insulating layer 113.

The active layer 122 is disposed so as to overlap the gate electrode 121. For example, the active layer 122 can be formed of an oxide semiconductor, amorphous silicon (a-Si), polycrystalline silicon (poly-Si), an organic semiconductor, or the like.

The source electrode 123 and the drain electrode 124 can be disposed on the active layer 122. The source electrode 123 and the drain electrode 124 are disposed on the same layer to be spaced apart from each other. The source electrode 123 and the drain electrode 124 can be in contact with the active layer 122 to be electrically connected to the active layer 122, but is not limited thereto. The source electrode 123 and the drain electrode 124 can be configured by any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

In some exemplary embodiments, an etch stopper can be disposed on the active layer 122 between the active layer 122 and the source electrode 123 and the drain electrode 124. The etch stopper can be a layer formed to suppress the damage of the surface of the active layer 122 due to the plasma when the source electrode 123 and the drain electrode 124 are patterned using an etching method.

A planarization layer 114 can be disposed above the thin film transistor 120.

The planarization layer 114 is an insulating layer which protects the thin film transistor 120 and makes the step of layers disposed above the lower substrate 110 gentle. The planarization layer 114 can be formed of one of an acrylic-based resin, an epoxy resin, a phenol resin, a polyamide-based resin, a polyimide-based resin, an unsaturated polyester-based resin, a photoresist, a polyphenylene-based resin, a polyphenylene sulfide-based resin, and benzocyclobutene, but is not limited thereto.

The organic light emitting diode 140 can be disposed above the planarization layer 114. The organic light emitting diode 140 is a self-emitting element and can be driven by the thin film transistor 120 disposed in each of the sub pixels. The organic light emitting diode 140 can include an anode 141, an organic light emitting layer 142 on the anode 141, and a cathode 143 on the organic light emitting layer 142.

The anode 141 can be disposed on the planarizing layer 114 to be separated for every sub pixel SP. The anode 141 can be electrically connected to the drain electrode 124 of the thin film transistor 120 through a contact hole formed on the planarization layer 114. In FIG. 2, it is illustrated that the anode 141 is electrically connected to the drain electrode 124 of the thin film transistor 120, the anode 141 can be electrically connected to the source electrode 123 of the thin film transistor 120 in accordance with a type of the thin film transistor 120.

The anode 141 is formed of a conductive material which is capable of supplying holes to the organic light emitting layer 142. As described above, when the display device 100 is a bottom emission type, the anode 141 can be configured by a transparent conductive layer formed of a conductive material having a high work function. For example, the anode 141 can be formed of transparent conductive oxide such as indium tin oxide (ITO), indium zinc oxide (IZO), indium tin zinc oxide (ITZO), zinc oxide (ZnO), and tin oxide (TO)-based, but is not limited thereto.

A bank 115 can be disposed on the anode 141 and the planarizing layer 114. Here, the bank 115 is an insulating layer for dividing adjacent sub pixels. The bank 115 can be formed to open a part of the anode 141. For example, the bank 115 can be formed of an organic insulating material formed to cover an edge of the anode 141 and can be formed of polyimide, acrylic or benzocyclobutene (BCB)-based resin, but is not limited thereto.

The organic light emitting layer 142 is a layer for emitting light having a specific color and can include at least one of a red light emitting layer, a green light emitting layer, a blue light emitting layer, and a white light emitting layer. The organic light emitting layer 142 can be disposed between the anode 141 and the cathode 143. The organic light emitting layer 142 can be configured by one light emitting layer or can be a structure in which a plurality of light emitting layers which emits different color light are laminated. Further, the organic light emitting layer 142 can further include an organic layer such as a hole injection layer, a hole transport layer, an electron transport layer, and an electron injection layer, in addition to the organic light emitting layer 142. Referring to FIG. 2, the organic light emitting layer 142 is disposed above the front surface of the lower substrate 110 to connect the organic light emitting layers 142 disposed in the sub pixels, but it is not limited thereto and all or some of the organic light emitting layers 142 can be disposed to be separated for every sub pixel.

The cathode 143 can be disposed on the organic light emitting layer 142. The cathode 143 can be formed of a conductive material which supplies electrons to the organic light emitting layer 142. When the display device 100 is a bottom emission type, the cathode 143 can be formed of a metal material such as silver (Ag), copper (Cu) or a magnesium-silver alloy.

In this specification, the pixel unit PP can be defined to include the thin film transistor 120, the organic light emitting diode 140, and the like. Therefore, in FIG. 3, for the convenience of illustration, the configuration of the active area AA in which the thin film transistor 120 and the organic light emitting diode 140 are disposed is schematically illustrated as the pixel unit PP.

Referring to FIGS. 2 and 3, an encapsulation layer 150 can be disposed above the pixel unit PP including the organic light emitting diode 140. The encapsulation layer 150 is a sealing member which protects the organic light emitting diode 140 from moisture, oxygen, and impact of the outside. The encapsulation layer 150 is in contact with the planarization layer 114 on the lower substrate 110 to seal the organic light emitting diode 140, but is not limited thereto and the encapsulation layer 150 can be in contact with the buffer layer 112. The encapsulation layer 150 can have a single-layered structure of an inorganic layer or a structure in which inorganic layers and organic layers can be alternately laminated, but is not limited thereto.

The upper substrate 111 can be disposed above the encapsulation layer 150. As illustrated in FIG. 3, the upper substrate 111 can be disposed to overlap the entire active area AA and a part of the non-active area NA, but is not limited thereto and can be disposed to overlap only the active area AA or overlap both the active area AA and the non-active area NA. The upper substrate 111 protects the organic light emitting diode 140 of the pixel unit PP together with the encapsulation layer 150. For example, the upper substrate 111 can protect the organic light emitting diode 140 of the pixel unit PP from moisture, oxygen, and impacts of the outside. Therefore, the upper substrate 111 can be formed of a metal material or an alloy material, which has a high corrosion resistance and is easily processed in the form of a foil or a thin film, such as aluminum (Al), nickel (Ni), chromium (Cr), iron (Fe), or Invar. As the upper substrate 111 is formed of a metal material or an alloy material, the upper substrate can be implemented in the form of an ultra-thin film and provides strong protection against external impacts and scratches.

At this time, an adhesive layer 160 can be disposed between the encapsulation layer 150 and the upper substrate 111. The adhesive layer 160 bonds the encapsulation layer 150 and the upper substrate 111 to fix the lower substrate 110 and the upper substrate 111. The adhesive layer 160 is formed of a material having an adhesiveness and can be a thermosetting, natural curable, or UV curable adhesive. For example, the adhesive layer 160 can be formed of an optical clear adhesive (OCA), a pressure sensitive adhesive (PSA), or the like, but is not limited thereto.

The adhesive layer 160 can be disposed to enclose the encapsulation layer 150 and the pixel unit PP. For example, the pixel unit can be sealed by the buffer layer 112 and the encapsulation layer 150 and the encapsulation layer 150 and the pixel unit PP can be sealed by the buffer layer 112 and the adhesive layer 160. The adhesive layer 160 can protect the organic light emitting diode 140 of the pixel unit from moisture, oxygen, and impacts of the outside together with the encapsulation layer 150 and the upper substrate 111. In this case, the adhesive layer 160 can further include an absorbent. The absorbent can be particles having hygroscopicity and absorb moisture and oxygen from the outside to minimize permeation of the moisture and oxygen into the pixel unit.

In the meantime, an optical member 116 can be further disposed below the lower substrate 110. The optical member 116 can be an arbitrary member which improves an optical characteristic of the display device 100. For example, the optical member 116 can be various films such as a polarization film, an anti-finger print film, a UV blocking film, but it is not limited thereto. Further, in accordance with the design of the display device 100, the optical member 116 can be omitted or two or more optical members 116 can be used.

Referring to FIGS. 1 and 3, a plurality of first pads P1 can be disposed in the non-active area NA, that is a pad area. The plurality of first pads P1 is conductive components which transmit various signals from the flexible film 130 to the pixel unit PP and the driving unit. For example, the plurality of first pads P1 can transmit various signals such as a data signal, a high potential voltage, a low potential voltage, or a clock signal through the wiring line. Even though in FIG. 3, it is illustrated that the plurality of first pads P1 is disposed on the buffer layer 112, it is not limited thereto, and the plurality of first pads P1 can be formed on various insulating layers which can be disposed in the non-active area NA, for example, on an inorganic insulating layer.

The flexible film 130 can be disposed in the non-active area NA of the lower substrate 110. The flexible film 130 is a film in which various components, such as the driving IC 132, are disposed on a base film 131 having a malleability. In this case, the flexible film 130 is a film which supplies signals to the sub pixel and the circuit of the active area AA and a second pad P2 of the flexible film 130 can be electrically connected to the first pad P1 disposed on the lower substrate 110. The flexible film 130 is disposed at one end of the non-active area NA to supply a data signal, a high potential voltage, a low potential voltage, a clock signal, and the like to the plurality of sub pixels and the circuits of the active area AA. Even though seven flexible films 130 are illustrated in FIG. 1, the number of flexible films 130 can vary depending on the design and is not limited thereto.

At this time, the conductive adhesive layer 117 can be interposed between the lower substrate 110 and the flexible film 130. The conductive adhesive layer 117 fixes the lower substrate 110 and the flexible film 130 and can electrically connect the first pad P1 on the lower substrate 110 and a second pad P2 of the flexible film 130. For example, the conductive adhesive layer 117 can be formed by dispersing conductive particles in an adhesive material and can be an anisotropic conductive film (ACF). The lower substrate 110 and the flexible film 130 are fixed by the adhesive material of the conductive adhesive layer 117 and the first pad P1 and the second pad P2 are electrically connected by means of an electrical path formed by the conductive particles.

Referring to FIG. 3, the planarization layer 114 can be disposed in the non-active area NA of the lower substrate 110. The planarization layer 114 can extend from the active area AA to a part of the non-active area NA. The cathode 143 can extend to a part of the non-active area NA and the cathode 143 can be in contact on the planarization layer 114, but it is not limited thereto. Further, the encapsulation layer 150 extends to a part of the non-active area NA to cover the cathode 143. The encapsulation layer 150 can be in contact with the planarization layer 114, but is not limited thereto. Further, in a state in which the adhesive layer 160 is interposed, the upper substrate 111 can be disposed so as to cover the encapsulation layer 150 and the planarization layer 114.

Referring to FIGS. 1 and 3, the sealing film 170 according to the first exemplary embodiment of the present disclosure can be disposed at a lower end of the non-active area NA of the lower substrate 110, for example, in the pad area.

However, the present disclosure is not limited thereto and the sealing film 170 of the present disclosure can also be disposed left, right, and upper ends of the non-active area NA of the lower substrate 110.

Referring to FIGS. 4A and 4B together, the sealing film 170 can include a first sealing film 170a and a second sealing film 170b. The first sealing film 170a is disposed in the pad area of the non-active area NA and includes an open hole H which exposes the first pad P1 and the second sealing film 170b is disposed on a top surface of the flexible film 130 to remove a step with the upper substrate 111.

At this time, the first sealing film 170a can be disposed in the pad area at a lower end of the non-active area NA, for example, at a lower end, excluding the left, right, and upper ends.

The first sealing film 170a includes an open hole H which exposes the first pad P1 and the first pad P1 and the second pad P2 of the flexible film 130 can be connected by means of the open hole H. The first sealing film 170a includes the number of open holes H corresponding to the number of flexible films 130.

In the meantime, in the flexible film 130, a first part 131a of the base film 131 on which the second pad P2 is attached is bent toward the first pad P1 to be connected to the first pad P1. Therefore, there can be a step between the first part 131a of the base film 131 and the second part 131b of the base film 131 to which the driving IC 132 is attached. However, this step is within several mm, so that the step can be ignorable as compared with heights of an upper end 170a' and a lower end 170a" of the first sealing film 170a. For example, the upper end 170a' and the lower end 170a" of the first sealing film 170a can have substantially the same height by ignoring the step, but the present disclosure is not limited thereto.

At this time, with respect to the open hole H, the upper end 170a' of the first sealing film 170a is located above the first part 131a of the base film 131, but the lower end 170a" of the first sealing film 170a can be located below the second part 131b of the base film 131.

The upper end 170a' of the first sealing film 170a is located on the buffer layer 112 and disposed between the upper substrate 111 and the adhesive layer 160 and the conductive adhesive layer 117, but is not limited thereto. The upper end 170a' of the first sealing film 170a can have a height to the top surface of the first part 131a of the base film 131, but is not limited thereto.

The lower end 170a" of the first sealing film 170a can be disposed between the buffer layer 112 and the second part 131b of the base film 131 and can be located on a side surface of the conductive adhesive layer 117. A side surface of the lower end 170a" of the first sealing film 170a can match side surfaces of the lower substrate 110 and the buffer layer 112, but is not limited thereto.

The second sealing film 170b can be disposed on a top surface of the upper end 170a' of the first sealing film 170a and a top surface of the first part 131a of the base film 131. The second sealing film 170b can be in contact with the side surfaces of the upper substrate 111 and the adhesive layer 160. The second sealing film 170b can have a height to the top surface of the upper substrate 111, but is not limited thereto.

The second sealing film 170b extends to a lower end in a portion where the flexible film 130 is disposed to cover a part of the top surface of the first part 131a of the base film 131.

A total thickness of the first sealing film 170a and the second sealing film 170b does not exceed 0.3 T, but is not limited thereto. For example, a total thickness of the first sealing film 170a and the second sealing film 170b can be 130 μm to 300 μm.

The sealing film 170 according to the first exemplary embodiment of the present disclosure serves to suppress the moisture permeation through the side surface of the display device 100 and minimize the defect during the subsequent process.

Referring to FIG. 4C together, the sealing film 170 can be configured to include a metal film 171 and an insulating layer 172 coated on a surface of the metal film 171.

For example, the sealing film 170 can be obtained by coating an anodized Al metal film 171 with silicon, titanium, or alumina to be insulated. Further, the sealing film 170 can be obtained by coating a Ni or Fe alloy with ceramic to be insulated, in addition to Al, but is not limited thereto.

Further, the sealing film 170 can further include an adhesive layer 173 therebelow.

A type of an adhesive which configures the adhesive layer 173 can include silicon, urethane, olefin, or epoxy-based adhesives. As the adhesive, a room temperature adhesive material or a thermal adhesive material can be included.

In the pad area of the lower substrate 110, the insulation from the first pad P1 can be maintained by the insulating layer 172 and the adhesive layer 173.

The display device 100 according to the first exemplary embodiment of the present disclosure configured as described above uses the sealing film 170 formed of a metal material instead of a sealing layer formed of a UV curable material of the related art. Therefore, when or if a defect occurs, the repairing process is possible and the lateral moisture permeability can be improved, which will be described in more detail by comparing with a comparative example.

Figure 5:
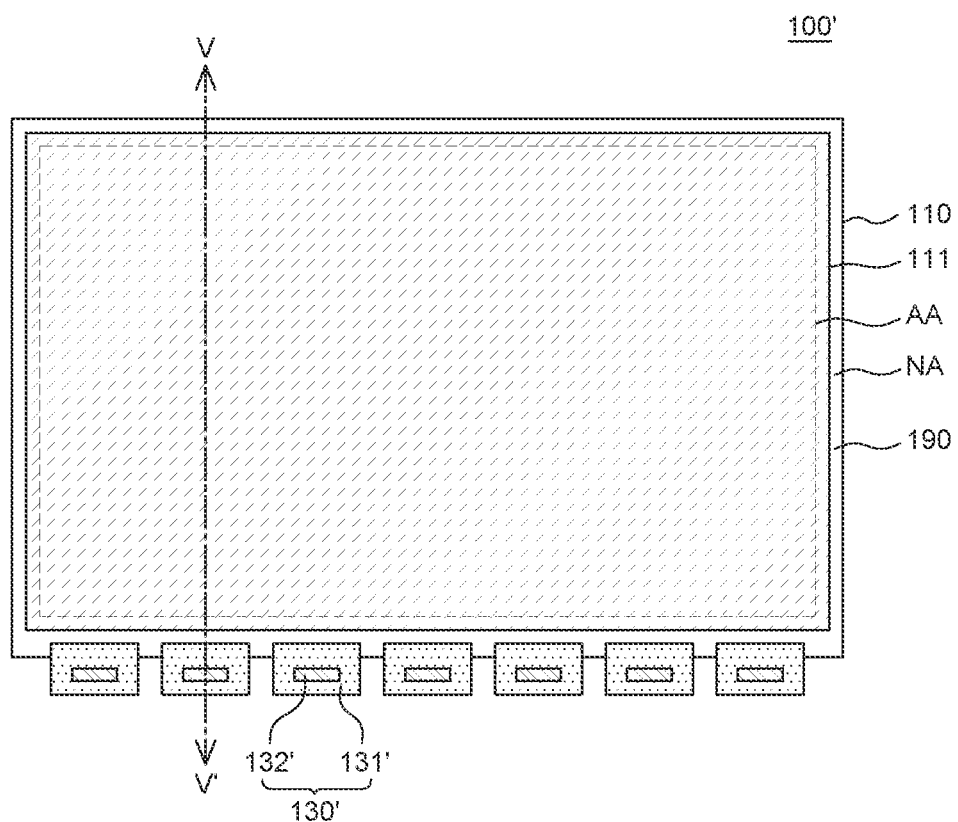
FIG. 5 is a schematic plan view of a display device according to a comparative example.

FIG. 5 is a schematic plan view of a display device according to a comparative example.

Figure 6:
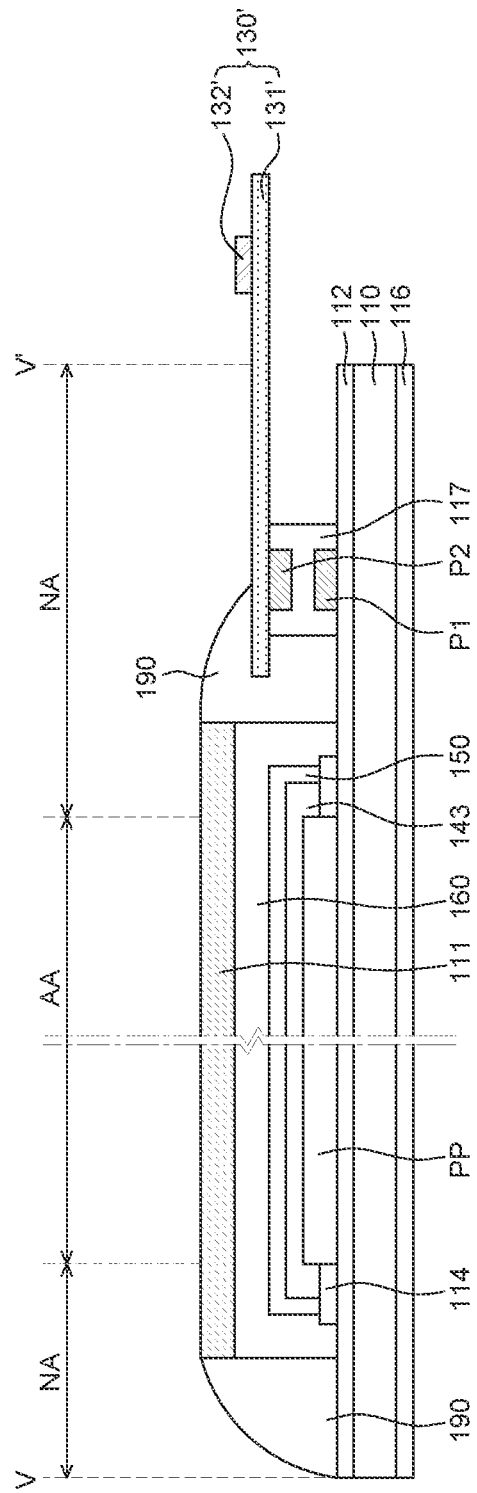
FIG. 6 is a cross-sectional view taken along the line V-V' of FIG. 5.

FIG. 6 is a cross-sectional view taken along the line V-V' of FIG. 5.

One difference between a display device 100' of the comparative example of FIGS. 5 and 6 and the display device 100 according to the first exemplary embodiment of the present disclosure of FIGS. 1 to 3 is a configuration of a sealing layer 190 and a flexible film 130'.

Referring to FIGS. 5 and 6, in the display device 100' of the comparative example, the sealing layer 190 can be disposed to cover the lower substrate 110 and the flexible film 130' to suppress the curl of the lower substrate 110 configured by polyimide (PI). For example, in the display device 100' using PI as the lower substrate 110, in order to suppress the curl of the PI lower substrate 110 after the laser lift-off (LLO) process, a micro seal process is performed to form a sealing layer 190.

The sealing layer 190 is disposed to enclose an edge of the non-active area NA of the lower substrate 110.

As described above, the flexible film 130 is a film in which various components, such as a driving IC 132', are disposed on a base film 131'.

At this time, the sealing layer 190 is formed by being coated and cured by a coating method such as printing and is formed of a material having a low viscosity so that the sealing layer is relatively vulnerable to the moisture permeation.

Therefore, the display device 100 according to the first exemplary embodiment of the present disclosure uses the sealing film 170 formed of a metal material, instead of the sealing layer 190 formed of a UV curable material, so that the vapor permeability can be improved. Accordingly, the display device 100 according to the first exemplary embodiment of the present disclosure can more effectively block the moisture permeating through the side surface and improve the reliability.

In the meantime, the micro seal process is a sol-based process so that a surface is not flat.

Therefore, in the display device 100 according to the first exemplary embodiment of the present disclosure, the sealing film 170 formed of a metal material is used to improve the flatness.

Further, the sealing layer 190 of the comparative example is cured by the curing process to be manufactured. For example, the sealing layer 190 can be formed by coating a material which configures the sealing layer 190 and then curing the material using the UV curing process. However, when the sealing layer 190 is cured, the adhesiveness is excellent so that it can be very difficult to separate the sealing layer 190 from the lower substrate 110. Specifically, when the lower substrate 190 is formed of a material having a flexibility, the lower substrate 110 can be damaged during the process of separating the sealing layer 190. Therefore, when the defect is generated during the manufacturing of the sealing layer 190, there can be a problem in that the entire display device 100' needs to be discarded. Further, the PI lower substrate 110 of the comparative example below the flexible film 130' is curled so that the tape automated bonding (TAB) repairing may not be performed and a defect may be caused during the subsequent process. Further, when the micro seal is overflown, a glass detachment failure can be caused by the micro seal cured during the LLO process in the comparative example.

To address these issues associated with the comparative example, in the display device 100 according to the first exemplary embodiment of the present disclosure, if a defect is generated during the manufacturing process of the sealing film 170, the repairing process for removing the sealing film 170 can be easily performed. Further, during the manufacturing process of the sealing film 170 or the subsequent process, the defect can be suppressed.

Further, in the rollable display device, the stress in the pad area and the GIP area need to be solved during the rolling of the display device 100'.

Therefore, in the display device 100 according to the first exemplary embodiment of the present disclosure, the above-described sealing film 170 reduces the stress in the pad area or the GIP area to suppress a crack during the rolling of the rollable display device.

In the meantime, as one defect of the micro seal, a corner step defect or a key alignment defect may be caused due to the unapplied micro seal in four corner areas of the display device 100'.

Therefore, in a second exemplary embodiment of the present disclosure, a sealing pattern is applied not only to a lower end of the non-active area of the lower substrate, but also to left, right, and upper ends, which will be described in detail with reference to FIGS. 7 to 11.

Figure 7:
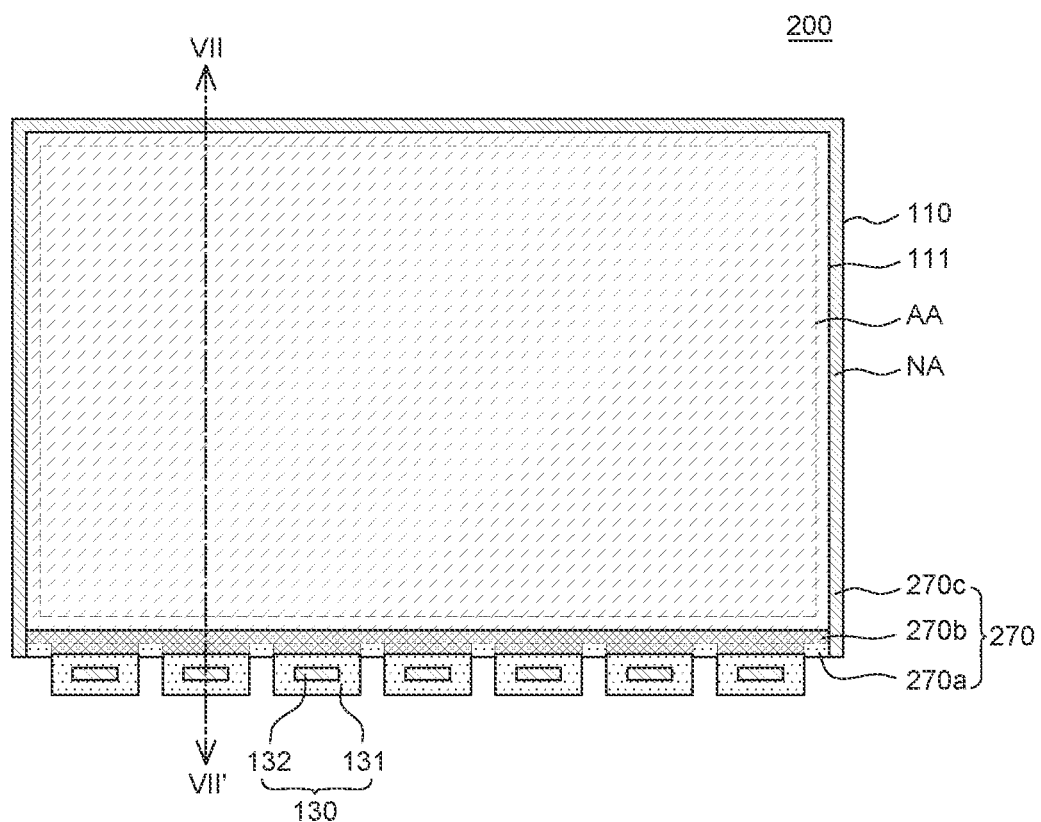
FIG. 7 is a schematic plan view of a display device according to a second exemplary embodiment of the present disclosure.

FIG. 7 is a schematic plan view of a display device according to the second exemplary embodiment of the present disclosure.

Figure 8:
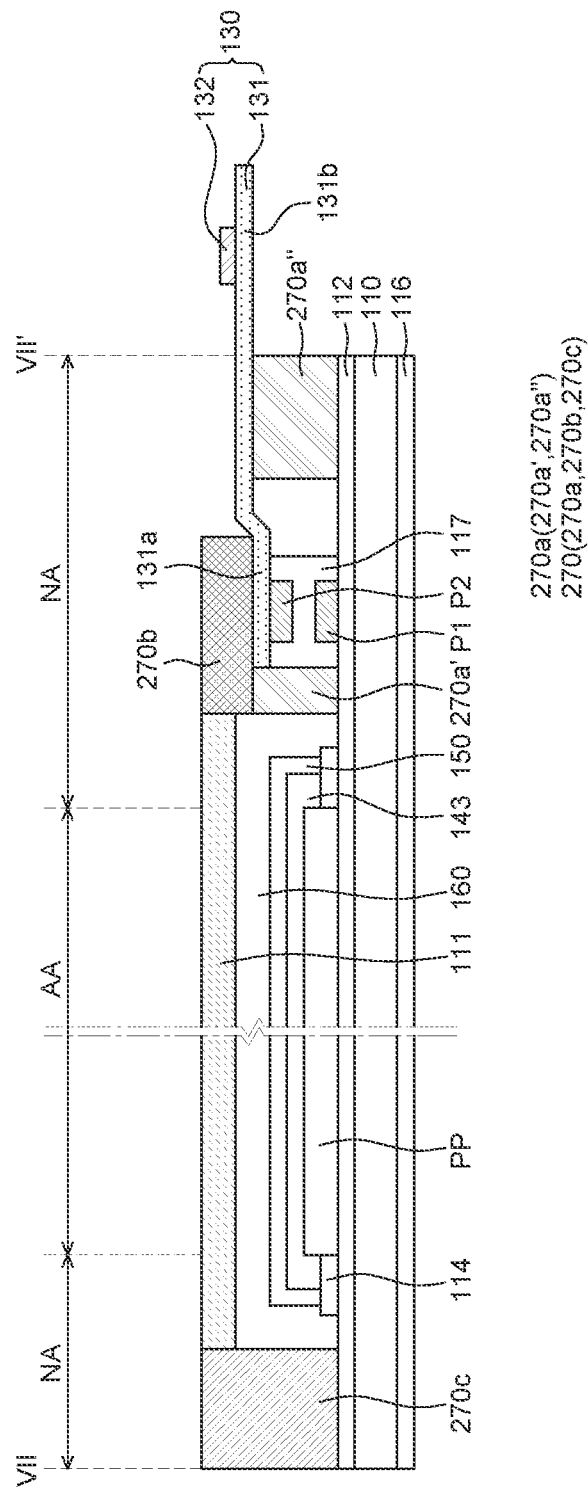
FIG. 8 is a cross-sectional view taken along the line VII-VII' of FIG. 7.

FIG. 8 is a cross-sectional view taken along the line VII-VII' of FIG. 7.

Figure 9A:
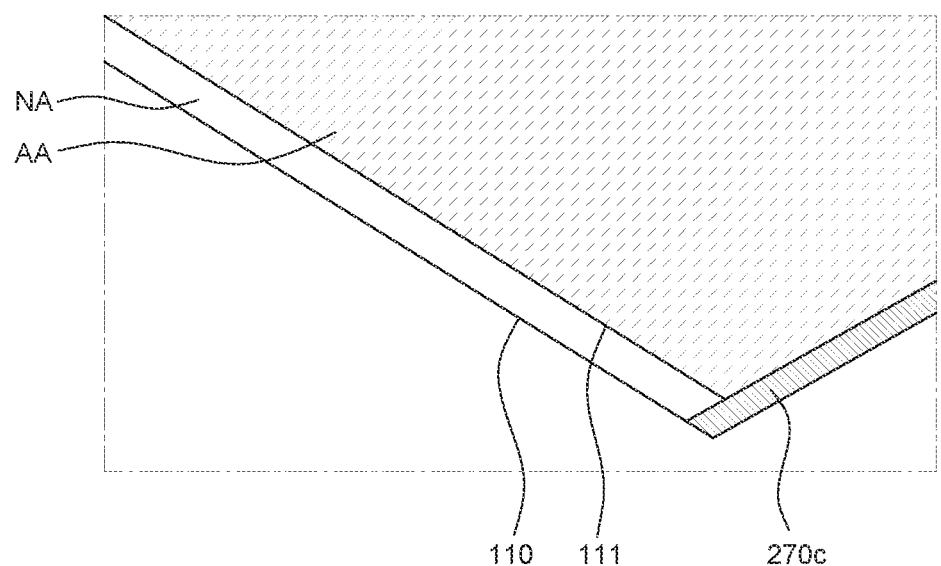
FIG. 9A is a perspective view illustrating a part of the display device of FIG. 7.
Figure 9B:
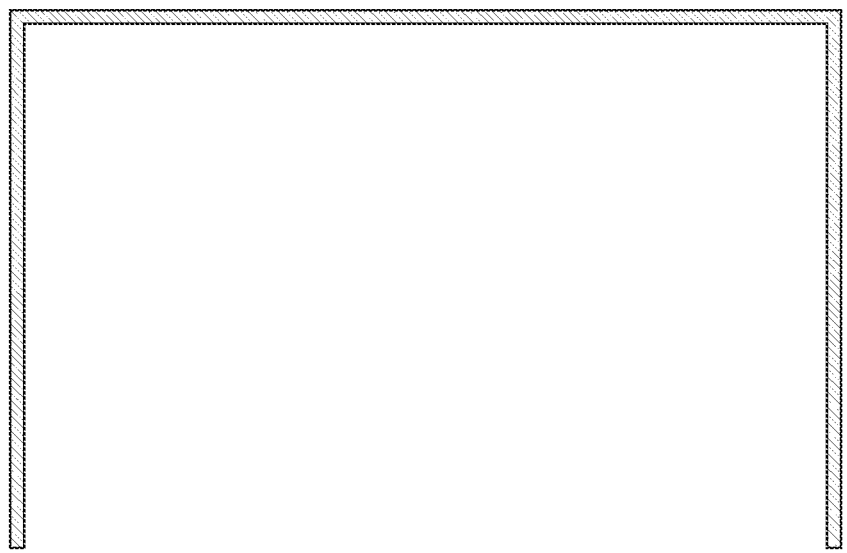
FIG. 9B is a plan view of a third sealing film of FIG. 9A.
Figure 10:
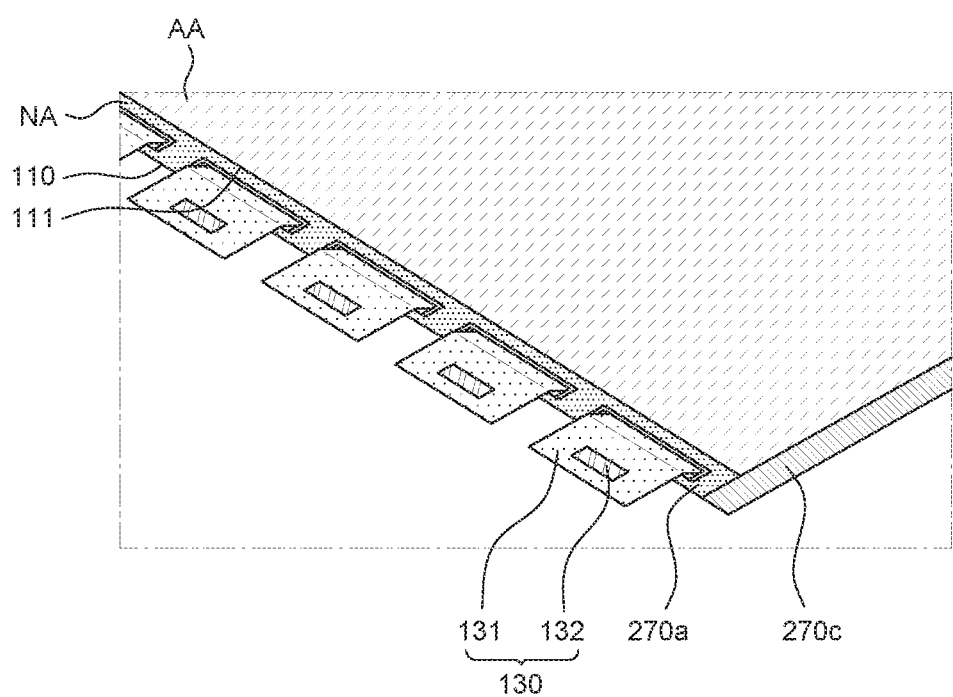
FIGS. 10 and 11 are perspective views illustrating a part of the display device of FIG. 7.
Figure 11:
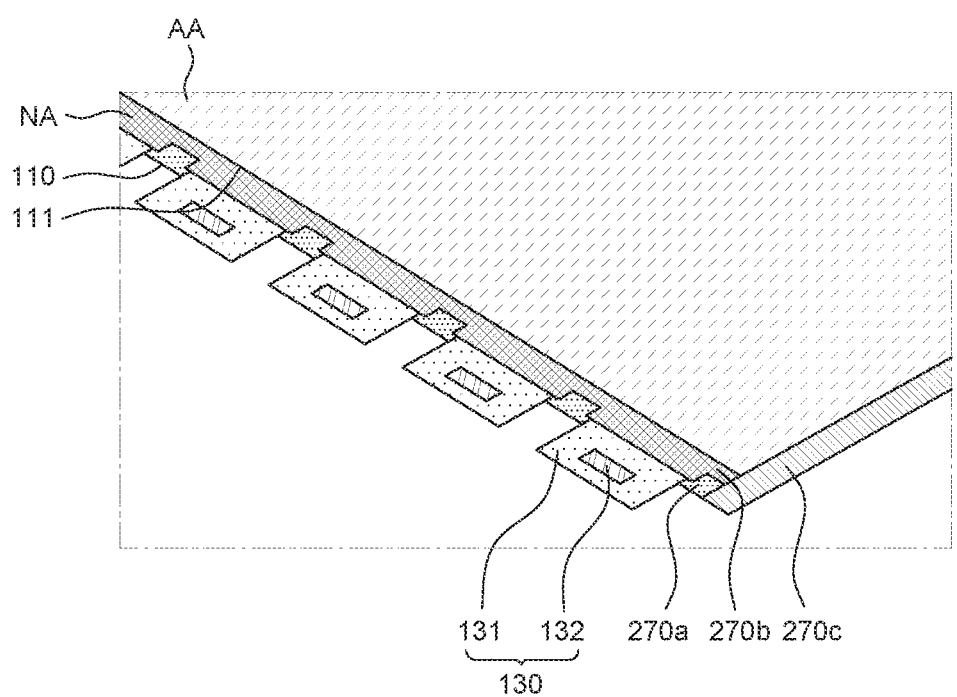

FIG. 9A is a perspective view illustrating a part of the display device of FIG. 7;

FIG. 9B is a plan view of a third sealing film of FIG. 9A;

FIGS. 10 and 11 are perspective views illustrating a part of the display device of FIG. 7.

The difference between a display device 200 of FIGS. 7 to 11 and the display device 100 of FIGS. 1 to 3 is a configuration of a sealing pattern 270, but the other configurations are substantially the same, so that a redundant description may be omitted or may be provided briefly. The same configuration will be denoted with the same reference numeral.

For the convenience of illustration, in FIG. 7, among various components of a display device 200, a lower substrate 110, an upper substrate 111, a flexible film 130, and a sealing film 270 are illustrated and in FIG. 8, a pixel unit PP is schematically illustrated.

For example, FIG. 9B illustrates a plan view of a third sealing film 270c and a first sealing film 270a and a second sealing film 270b can refer to FIGS. 4A and 4B.

FIGS. 9A, 10, and 11 illustrate a part of the display device 200 in which the third sealing film 270c, the first sealing film 270a, and the second sealing film 270b are sequentially attached. However, an attachment order of the sealing pattern 270 is not limited to the above-described order.

Hereinafter, for the convenience of description, it is described that the display device 200 according to the second exemplary embodiment of the present disclosure is an organic light emitting display device, specifically, a bottom emission type organic light emitting display device, but it is not limited thereto.

Referring to FIGS. 7 to 11, the display device 200 according to the second exemplary embodiment of the present disclosure can include a lower substrate 110, a thin film transistor, an organic light emitting diode, a flexible film 130, a sealing film 270, and an upper substrate 111.

The lower substrate 110 is a base member for supporting other components of the display device 200 and can be configured by an insulating material.

Further, the lower substrate 110 can be formed of a material having a flexibility. Therefore, the display device 200 according to the second exemplary embodiment of the present disclosure can be applied to various flexible display devices, such as a foldable display device, a rollable display device, and a stretchable display device. In this case, the lower substrate 110 can be formed of, for example, a plastic material such as polyimide (PI).

The lower substrate 110 can include an active area AA and a non-active area NA.

The non-active area NA can be an area which encloses the active area AA, as illustrated in FIG. 7, but it is not limited thereto and the non-active area NA can be defined as an area extending from the active area AA.

Referring to FIGS. 7 and 8, a plurality of first pads P1 can be disposed in the non-active area NA, that is a pad area. Even though in FIG. 8, it is illustrated that the plurality of first pads P1 is disposed on the buffer layer 112, it is not limited thereto and the plurality of first pads P1 can be formed on various insulating layers which can be disposed in the non-active area, for example, on an inorganic insulating layer.

The flexible film 130 can be disposed in the non-active area NA of the lower substrate 110. The flexible film 130 is a film in which various components, such as the driving IC 132, are disposed on a base film 131 having a malleability. In this case, the flexible film 130 is a film which supplies signals to the sub pixel and the circuit of the active area AA and a second pad P2 of the flexible film 130 can be electrically connected to the first pad P1 disposed on the lower substrate 110.

At this time, the conductive adhesive layer 117 can be interposed between the lower substrate 110 and the flexible film 130.

Referring to FIG. 8, the planarization layer 114 can be disposed in the non-active area NA of the lower substrate 110. The planarization layer 114 extends from the active area AA to a part of the non-active area NA. The cathode 143 can extend to a part of the non-active area NA and the cathode 143 can be in contact on the planarization layer 114, but it is not limited thereto. Further, the encapsulation layer 150 extends to a part of the non-active area NA to cover the cathode 143. The encapsulation layer 150 can be in contact with the planarization layer 114, but is not limited thereto. Further, in a state in which the adhesive layer 160 is interposed, the upper substrate 111 can be disposed so as to cover the encapsulation layer 150 and the planarization layer 114.

Referring to FIGS. 7 and 8, the sealing film 270 according to the second exemplary embodiment of the present disclosure can be disposed at the edge of the non-active area NA of the lower substrate 110.

The sealing film 270 according to the second exemplary embodiment of the present disclosure includes a first sealing film 270a, a second sealing film 270b, and a third sealing film 270c. The first sealing film 270a is disposed at a lower end of the non-active area NA, for example, in the pad area and includes an open hole which exposes the first pad P1. The second sealing film 270b is disposed on a top surface of the flexible film 130 to remove the step with the upper substrate 111 and the third sealing film 270c is disposed on left, right, and upper ends of the non-active area NA.

As described above, the sealing film 270 can be configured to include a metal film and an insulating layer coated on a surface of the metal film.

For example, the sealing film 270 can be obtained by coating an anodized Al metal film with silicon, titanium, or alumina to be insulated. Further, the sealing film 270 can be obtained by coating a Ni or Fe alloy with ceramic to be insulated, in addition to Al, but is not limited thereto.

Further, the sealing film 270 can further include an adhesive layer therebelow.

A type of an adhesive which configures the adhesive layer can include silicon, urethane, olefin, or epoxy-based adhesives. As the adhesive, a room temperature adhesive material or a thermal adhesive material can be included.

As described above, the display device 200 according to the second exemplary embodiment of the present disclosure uses a sealing film 270 formed of a metal material, instead of the sealing layer, to improve the moisture permeability. Further, the third sealing film 270c is added to the display device 200 according to the second exemplary embodiment of the present disclosure so that the moisture permeating through the side surface can be more effectively blocked and thus the reliability can be improved.

Further, in the display device 200 according to the second exemplary embodiment of the present disclosure, the sealing film 270 formed of a metal material is used to improve the flatness.

Therefore, in the display device 200 according to the second exemplary embodiment of the present disclosure, when the defect is generated during the manufacturing process of the sealing film 270, the repairing process for removing the sealing film 270 can be easily performed. Further, during the manufacturing process of the sealing film 270 or the subsequent process, the defect can be suppressed.

For example, referring to FIGS. 7, 8, 9A, and 9B, the third sealing film 270c can be disposed at left, right, and upper edges of the non-active area NA of the lower substrate 110 with a predetermined width.

At this time, the third sealing film 270c can extend to the pad area of the non-active area NA, but is not limited thereto.

The third sealing film 270c can have an inner surface which is in contact with the upper substrate 111 and the adhesive layer 160 and an outer surface which can match the side surfaces of the lower substrate 110 and the buffer layer 112, but is not limited thereto.

The third sealing film 270c can have a height to the top surface of the upper substrate 111 and planarize the surface, but is not limited thereto.

As described above, the third sealing film 270c formed of a metal material is disposed on three edges of the non-active area NA so that it is possible to fundamentally suppress corner step defects and key alignment defects due to the unapplied micro seals in the corner area.

Further, referring to FIGS. 7, 8, and 10, the first sealing film 270a can be disposed at a lower end of the non-active area NA of the lower substrate 110, for example, in the pad area.

The first sealing film 270a includes an open hole which exposes the first pad P1 and the first pad P1 and the second pad P2 of the flexible film 130 can be connected by means of the open hole.

Similarly to the above-described first exemplary embodiment of the present disclosure, the upper end 270a' of the first sealing film 270a is located above the first part 131a of the base film 131, but the lower end 270a" of the first sealing film 270a can be located below the second part 131b of the base film 131.

The upper end 270a' of the first sealing film 270a is located on the buffer layer 112 and disposed between the upper substrate 111 and the adhesive layer 160 and the conductive adhesive layer 117, but is not limited thereto. The upper end 270a' of the first sealing film 270a can have a height to the top surface of the first part 131a of the base film 131, but is not limited thereto.

The lower end 270a" of the first sealing film 270a can be disposed between the buffer layer 112 and the second part 131b of the base film 131 and can be located on a side surface of the conductive adhesive layer 117. A side surface of the lower end 270a" of the first sealing film 270a can match side surfaces of the lower substrate 110 and the buffer layer 112, but is not limited thereto.

Left and right sides of the first sealing film 270a can be in contact with the third sealing film 270c.

Further, referring to FIGS. 7, 8, and 11, the second sealing film 270b can be disposed on a top surface of the upper end 270a' of the first sealing film 270a and a top surface of the first part 131a of the base film 131. The second sealing film 270b can be in contact with the side surfaces of the upper substrate 111 and the adhesive layer 160. The second sealing film 270b can have a height to the top surface of the upper substrate 111, but is not limited thereto.

The second sealing film 270b extends to a lower end in a portion where the flexible film 130 is disposed to cover a part of the top surface of the first part 131a of the base film 131.

The sealing film 270 according to the second exemplary embodiment of the present disclosure serves to suppress the moisture permeation through the side surface of the display device 200 and minimize the defect during the subsequent process.

Further, in the rollable display device 200, the sealing film 270 reduces the stress in the pad area or the GIP area to suppress the crack during the rolling of the rollable display device 200, which will be described in more detail with reference to FIGS. 12 and 13.

Figure 12:
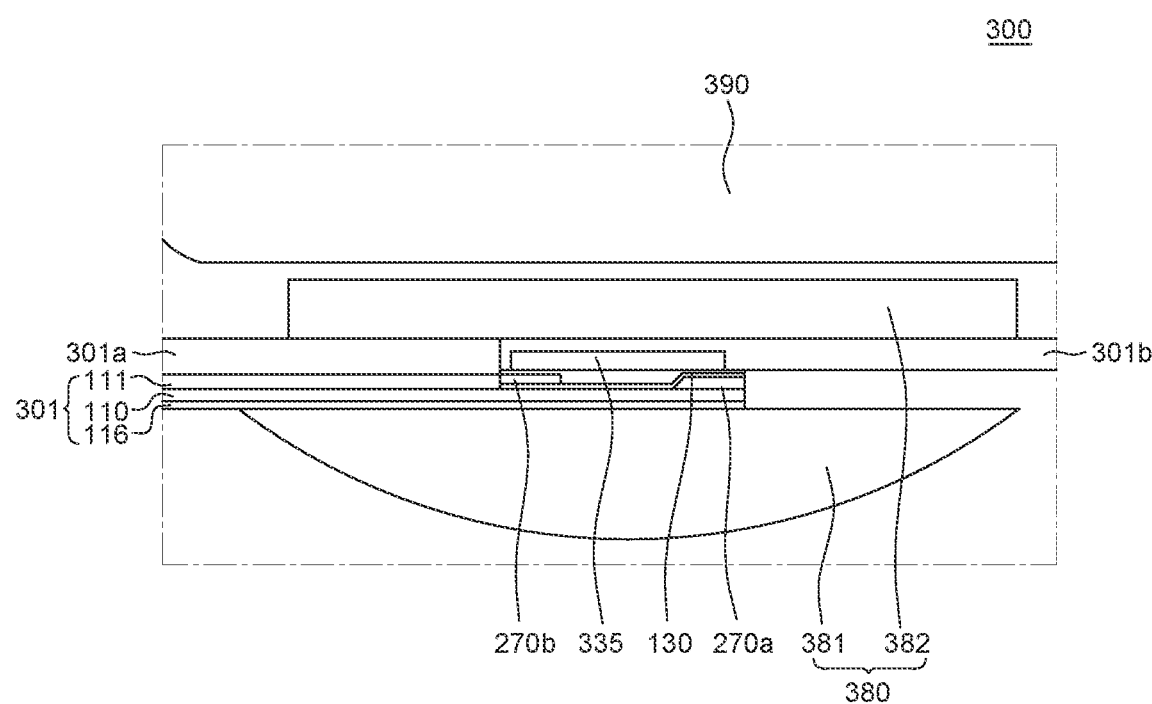
FIG. 12 is a cross-sectional view of a part of a rollable display device according to a third exemplary embodiment of the present disclosure.

FIG. 12 is a cross-sectional view of a part of a rollable display device according to a third exemplary embodiment of the present disclosure.

Figure 13:
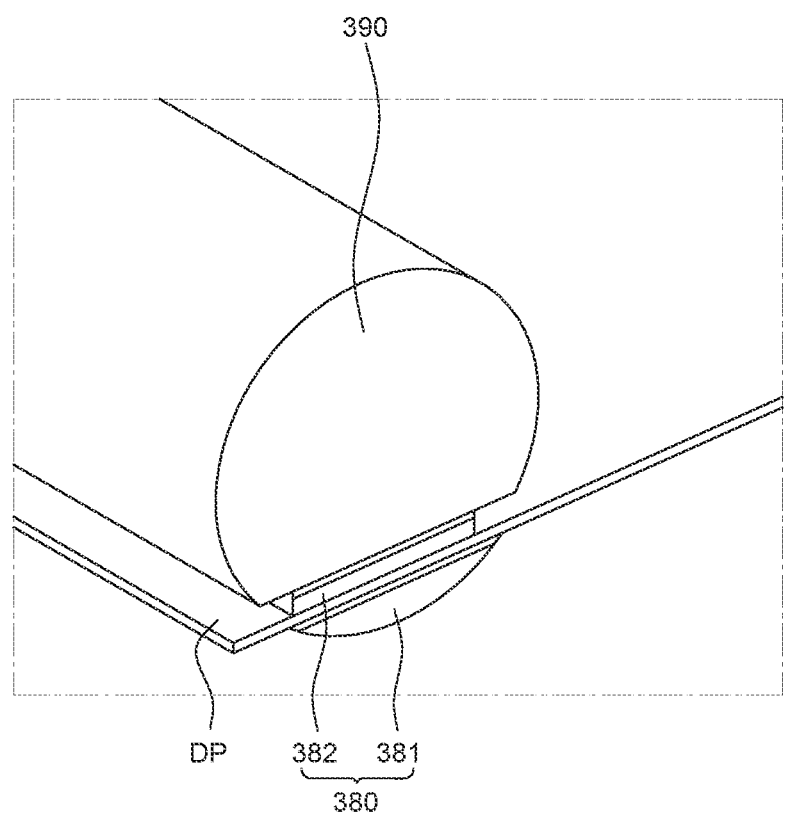
FIG. 13 is a perspective view of a part of a rollable display device according to the third exemplary embodiment of the present disclosure.

FIG. 13 is a perspective view of a part of a rollable display device according to the third exemplary embodiment of the present disclosure.

Except that in a rollable display device 300 of FIGS. 12 and 13, sealing patterns 270a and 270b are applied to the rollable display device 300, the other components are substantially the same in comparison with the previous embodiment(s), so that a redundant description will be omitted or may be provided briefly. The same configuration will be denoted with the same reference numeral.

First, the rollable display device 300 can also be referred to as a display device 300 which is capable of displaying images even in a rolled state. The rollable display device 300 can have a high flexibility as compared with a general display device. Depending on whether to use a rollable display device 300, a shape of the rollable display device 300 can freely vary. Specifically, when the rollable display device 300 is not used, the rollable display device 300 is rolled to be stored with a reduced volume. In contrast, when the rollable display device 300 is used, the rolled rollable display device 300 is unrolled to be used.

Referring to FIGS. 12 and 13, the rollable display device 300 according to the third exemplary embodiment of the present disclosure includes a display unit DP and a driving unit including a roller 390.

The display unit DP can be configured to be wound or unwound by means of the roller 390. For example, the display unit DP can be formed of a display panel 301, a back cover 301a, and an extending sheet 301b each having a flexibility to be wound or unwound.

The display unit DP is a configuration for displaying images to a user and for example, in the display unit DP, a display element and a circuit, a wiring line, and a component for driving the display element can be disposed.

The roller 390 is a member around which the display unit DP is wound. The roller 390 can be, for example, formed to have a cylindrical shape. However, it is not limited thereto and it can be applied to all structures such as a single or double stage D-cut structure, a back or front folding D-cut structure in accordance with the placement of the printed circuit board 335, or a cylindrical shape. A lower edge of the display unit DP can be fixed to the roller 390. When the roller 390 rotates, the display unit DP which is fixed to the roller 390 through the lower edge can be wound around the roller 390. In contrast, when the roller 390 rotates in an opposite direction, the display unit DP which is wound around the roller 390 can be unwound from the roller 390. The roller 390 can be formed of a metal material or a plastic material having a rigidity.

At this time, the back cover 301a is disposed on rear surfaces of the display panel 301, the flexible film 130, and the printed circuit board 335 to support the display panel 301, the flexible film 130, and the printed circuit board 335. Therefore, a size of the back cover 301a can be larger than a size of the display panel 301. Therefore, the back cover 301a can protect other configurations of the display unit DP from the outside.

Even though the back cover 301a is formed of a material having a rigidity, at least a part of the back cover 301a can have a flexibility to be wound or unwound together with the display panel 301. For example, the back cover 301a can be formed of a metal material such as steel use stainless (SUS) or invar or plastic. However, as long as a material of the back cover 301a satisfies physical conditions such as a thermal strain, a radius of curvature, and a rigidity, the material can be diversely changed depending on the design, and is not limited thereto.

The cover unit 380 is disposed at a lower side of the display panel 301 and, at the same time, an upper side of the extending sheet 301b can be fastened with the cover unit 380. Further, the extending sheet 301b extends downwardly so that the lowermost edge can be fastened with the roller 390. The extending sheet 301 is not limited the name of "sheet", but can also be referred to as various names such as a plate or a layer. The extending sheet 301b can be formed of a plastic such as polypropylene (PP), or polycarbonate (PC), or polyethylene terephthalate (PET), but is not limited thereto. The extending sheet 301b can be formed of the same material as the back cover 301a. Further, the back cover 301a can extend to replace the extending sheet 301b.

In the meantime, the cover unit 380 according to the third exemplary embodiment of the present disclosure includes a top cover 381 and a bottom cover 382, but is not limited thereto.

The flexible film 130 is disposed at one end of the non-active area of the display panel 301 and the printed circuit board 335 is disposed on a top surface of the extending sheet 301b to be connected to the flexible film 130. However, the present disclosure is not limited thereto so that the printed circuit board 335 can be disposed on a rear surface of the extending sheet 301b.

The bottom cover 382 of the cover unit 380 is disposed on rear surfaces of the back cover 301a and the extending sheet 301b to support the display unit DP. The top cover 381 is disposed on the top surface of the display unit DP to cover the flexible film 130 in the pad area and protect the flexible film 130.

In the meantime, in the rollable display device 300 according to the third exemplary embodiment of the present disclosure, the above-described sealing films 270a and 270b reduce the stress in the pad area or the GIP area to suppress the crack during the rolling of the rollable display device 300. For example, the sealing films 270a and 270b suppress the curl of the lower substrate 110 and support the pad area and the GIP area to reduce the stress in accordance with the rolling.

The exemplary embodiments of the present disclosure can also be described as follows:

According to an aspect of the present disclosure, there is provided a display device. The display device includes a lower substrate which is divided into an active area and a non-active area, an upper substrate disposed above the lower substrate, a flexible film which is connected to a pad area of the lower substrate in the non-active area, a first sealing film which is disposed in the pad area and includes at least one open hole and a second sealing film which is disposed on a top surface of the flexible film and a side surface of the upper substrate.

The display device can further include a back cover disposed on a rear surface of the lower substrate, an extending sheet which can be fastened with a lower side of the lower substrate on the rear surface of the lower substrate and a roller which can be fastened with the extending sheet to wind or unwind the lower cover, the back cover, and the extending sheet.

The lower substrate can be made of polyimide.

The display device can further include an insulating layer disposed on the lower substrate, a pixel unit which can be disposed on the lower substrate of the active area and can include an organic light emitting diode and an encapsulation layer disposed above the pixel unit.

The display device can further include another insulating layer disposed on the insulating layer, wherein the other insulating layer can extend to a part of the other insulating layer in the active area, and the encapsulation layer can be in contact with the other insulating layer.

The upper substrate can be disposed to overlap the entire active area and a part of the non-active area.

The display device can further include an adhesive layer which can be disposed between the encapsulation layer and the upper substrate and can enclose the encapsulation layer and the pixel unit.

The display device can further include a first pad disposed in the pad area, a second pad disposed in the flexible film and a conductive adhesive layer which can be disposed between the lower substrate and the flexible film to electrically connect the first pad and the second pad.

The open hole can expose the first pad and the first pad and the second pad can be connected by means of the open hole.

The flexible film includes a first part of a base film to which the second pad can be attached and a second part of the base film to which a driving IC can be attached.

An upper end of the first sealing film can be located above the first part of the base film and a lower end of the first sealing film can be located below the second part of the base film.

The upper end of the first sealing film can be disposed on the insulating layer and can be disposed between the upper substrate and the adhesive layer and the conductive adhesive layer, and the upper end of the first sealing film can have a height to a top surface of the first part of the base film.

A lower end of the first sealing film can be disposed between the insulating layer and the second part of the base film and can be located on a side surface of the conductive adhesive layer, and a side surface of the lower end of the first sealing film can match side surfaces of the lower substrate and the insulating layer.

The second sealing film can be disposed on a top surface of the upper end of the first sealing film and a top surface of the first part of the base film and can be in contact with the side surfaces of the upper substrate and the adhesive layer and the second sealing film can have a height to a top surface of the upper substrate.

The second sealing film can extend to a lower end in a portion in which the flexible film can be disposed to cover a part of a top surface of the first part of the base film.

The display device can further include a third sealing film which can be disposed at left, right, and upper edges of the lower substrate of the non-active area.

An inner surface of the third sealing film can be in contact with the upper substrate and the adhesive layer and an outer surface can match side surfaces of the lower substrate and the insulating layer.

The third sealing film can have a height to a top surface of the upper substrate.

The first sealing film to the third sealing film can include a metal film and an insulating layer coated on a surface of the metal film.

The display device can further include an adhesive layer attached below the first sealing film to the third sealing film.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a first substrate which is divided into an active area and a non-active area;
   a second substrate disposed above the first substrate;
   a flexible film which is connected to a pad area of the first substrate in the non-active area;
   a first sealing film which is disposed in the pad area and includes at least one open hole; and
   a second sealing film which is disposed on a top surface of the flexible film and a side surface of the second substrate.

2. The display device according to claim 1, further comprising:
   a back cover disposed on a rear surface of the first substrate;
   an extending sheet which is fastened with a lower side of the first substrate on the rear surface of the first substrate; and
   a roller which is fastened with the extending sheet to wind or unwind a lower cover, the back cover, and the extending sheet.

3. The display device according to claim 1, wherein the first substrate is made of polyimide.

4. The display device according to claim 1, further comprising:
   an insulating layer disposed on the first substrate;
   a pixel unit which is disposed on the first substrate of the active area and includes an organic light emitting diode; and
   an encapsulation layer disposed above the pixel unit.

5. The display device according to claim 4, further comprising:
   another insulating layer disposed on the insulating layer, wherein the another insulating layer extends to a part of the another insulating layer in the active area, and the encapsulation layer is in contact with the another insulating layer.

6. The display device according to claim 1, wherein the second substrate is disposed to overlap the entire active area and a part of the non-active area.

7. The display device according to claim 4, further comprising:
an adhesive layer which is disposed between the encapsulation layer and the second substrate, and encloses the encapsulation layer and the pixel unit.

8. The display device according to claim 4, further comprising:
a first pad disposed in the pad area;
a second pad disposed in the flexible film; and
a conductive adhesive layer which is disposed between the first substrate and the flexible film to electrically connect the first pad and the second pad.

9. The display device according to claim 8, wherein the open hole of the first sealing film exposes the first pad, and the first pad and the second pad are connected by the open hole.

10. The display device according to claim 8, wherein the flexible film includes:
a first part of a base film to which the second pad is attached; and
a second part of the base film to which a driving integrated circuit (IC) is attached.

11. The display device according to claim 10, wherein an upper end of the first sealing film is located above the first part of the base film, and a lower end of the first sealing film is located below the second part of the base film.

12. The display device according to claim 11, wherein the upper end of the first sealing film is disposed on the insulating layer and is disposed between the second substrate and the adhesive layer and the conductive adhesive layer, and the upper end of the first sealing film has a height corresponding to a top surface of the first part of the base film.

13. The display device according to claim 11, wherein a lower end of the first sealing film is disposed between the insulating layer and the second part of the base film and is located on a side surface of the conductive adhesive layer, and a side surface of the lower end of the first sealing film matches side surfaces of the first substrate and the insulating layer.

14. The display device according to claim 11, wherein the second sealing film is disposed on a top surface of the upper end of the first sealing film and a top surface of the first part of the base film and is in contact with the side surfaces of the second substrate and the adhesive layer, and the second sealing film has a height corresponding to a top surface of the second substrate.

15. The display device according to claim 11, wherein the second sealing film extends to a lower end in a portion in which the flexible film is disposed to cover a part of a top surface of the first part of the base film.

16. The display device according to claim 8, further comprising:
a third sealing film which is disposed at left, right, and upper edges of the first substrate of the non-active area.

17. The display device according to claim 16, wherein an inner surface of the third sealing film is in contact with the second substrate and the adhesive layer, and an outer surface matches side surfaces of the first substrate and the insulating layer.

18. The display device according to claim 16, wherein the third sealing film has a height corresponding to a top surface of the second substrate.

19. The display device according to claim 16, wherein the first sealing film to the third sealing film include a metal film and an insulating layer coated on a surface of the metal film.

20. The display device according to claim 16, further comprising:
an adhesive layer attached below the first sealing film to the third sealing film.

* * * * *